United States Patent [19]
Sim et al.

[11] Patent Number: 6,075,384
[45] Date of Patent: Jun. 13, 2000

[54] CURRENT-MODE BIDIRECTIONAL INPUT/OUTPUT BUFFER

[75] Inventors: Jae-Yoon Sim, Kwangjukwangyeok; Hong-Joon Park, Pohang; Soo-In Cho, Seoul; Jung-Bae Lee, Gunpo, all of Rep. of Korea

[73] Assignee: Samsung Electronics, Co., Ltd., Suwon, Rep. of Korea

[21] Appl. No.: 09/049,739

[22] Filed: Mar. 27, 1998

[30] Foreign Application Priority Data

Mar. 27, 1997 [KR] Rep. of Korea ........................ 97-10737

[51] Int. Cl.[7] .............................................. H03K 19/0175
[52] U.S. Cl. ................................ 326/86; 326/82; 326/83
[58] Field of Search .................... 326/30, 82, 83, 326/86, 112, 119, 121

[56] References Cited

U.S. PATENT DOCUMENTS 5,587,709  12/1996  Jeong ........................................ 341/100
5,604,450   2/1997  Borkar et al. ............................. 326/82

*Primary Examiner*—Michael Tokar
*Assistant Examiner*—Anh Tran
*Attorney, Agent, or Firm*—Marger Johnson & McCollom, P.C.

[57] ABSTRACT

A bidirectional input/output buffer operates in a current mode to increase the data transfer rate between devices connected by a bidirectional transmission line. The buffer includes an output current source for generating an output current responsive to a data output signal. The output current is combined with an output current indicative of a data input signal received from another device over a transmission line, thereby forming a mixed current signal. The data input signal is restored from the mixed signal by a restoring circuit that compares the mixed signal to a reference current that depends on the value of the data output signal. The restoring circuit includes a current mirror and a reference current source that generates a reference current in response to the data output signal. To provide additional performance, an embodiment of a bidirectional input/output buffer utilizes a switchless structure having two comparators that compare the mixed signal to two different reference signals, thereby generating two comparison signals. A selector circuit selects one of the two comparison signals as the restored data input signal responsive to the data output signal.

19 Claims, 5 Drawing Sheets

CURRENT-MODE BIDIRECTIONAL INPUT/OUTPUT BUFFER

This application corresponds to Korean patent application No. 10737/1997 filed Mar. 27, 1997 in the name of Samsung Electronics Co., Ltd., which is herein incorporated by reference for all purposes.

BACKGROUND OF THE INVENTION

1. Field of the Invention

The present invention relates to bidirectional input/output buffers which are capable of simultaneously transmitting data in two directions through one transmission line, and more particularly, to a bidirectional input/output buffer that operates in current mode.

2. Description of the Related Art

Improvements in the performance of high-speed integrated circuits have been limited by data transmission speeds between chips. In high-speed data communications, bidirectional input/output system, which can transmit data in both directions through a single cable, are advantageous because data input and output can be performed simultaneously using only one pin in a system having a limited number usable pins. A bidirectional input/output buffer restores a data input signal from mixed input/output signals. The speed of a bidirectional buffer is typically limited by the speed of the restoring circuit.

FIG. 1 is a schematic diagram illustrating the construction of a conventional bidirectional input/output buffer. As shown in FIG. 1, a conventional bidirectional input/output buffer includes a voltage signal terminal IN1, an output terminal OUT1, a receiving terminal RE1, a reference voltage generator 103A, an output buffer 101A, and a voltage comparator 102A.

In operation, an output data signal, which is to be transmitted to an external device, is applied to terminal IN1. The restored value of a signal received from an external device appears at terminal RE1. Reference voltage generator 103A generates a reference voltage Vref1 according to the logic value of signal applied to terminal IN1. The voltage comparator 102A restores the signal received from an external device by comparing the voltage of the output terminal OUT1, which carries a mixed signal which is a combination of the signal to be transmitted to an external device and the signal received from the external device, with the reference voltage Vref1.

The operation of the buffer of FIG. 1 will now be described in more detail. The voltage at the output terminal OUT1 is a composite voltage which corresponds to the average value of the voltages of the signals transmitted by two chips 100A and 100B. Assuming that there are two voltage values 0 V and Vh representing two logic values that can be transmitted between the two chips 100A and 100B, the voltage at the output terminal OUT1 can be either Vh, 0.5×Vh, or 0 V. That is, if both of the voltage signals at terminals IN1 and IN2 are at logic "HIGH" levels, the voltage at output terminal OUT1 is Vh; if only one of the voltage signal at terminals IN1 and IN2 are "HIGH", the voltage at output terminal OUT1 is 0.5×Vh; and if both of the voltage signal terminals IN1 and IN2 are at logic "LOW" levels, OUT1 is at 0 V. Therefore, a restored voltage signal is generated at the receiving terminal RE1 by comparing the reference voltage Vref1, which is selected according to the voltage signal φIN1, with the voltage of the output terminal OUT1.

The following Table 1 shows the values of the restored signals RE1 and RE2, the values of the reference voltages Vref1 and Vref2, and the values of the signals OUT1 and OUT2 for various combinations of φIN1 and φIN2.

TABLE 1

| φIN1 | "0" (LOW) | "0" (LOW) | "1" (HIGH) | "1" (HIGH) |
|---|---|---|---|---|
| φIN2 | "0" (LOW) | "1" (HIGH) | "0" (LOW) | "1" (HIGH) |
| Vref1 | 0.25 × Vh | 0.25Vh | 0.75 × Vh | 0.75 × Vh |
| Vref2 | 0.25 × Vh | 0.75 × Vh | 0.25 × Vh | 0.75 × Vh |
| OUT1 (=OUT2) | 0 | 0.5 × Vh | 0.5 × Vh | Vh |
| restored signal (RE1) | "0" (LOW) | "1" (HIGH) | "0" (LOW) | "1" (HIGH) |
| restored signal (RE2) | "0" (LOW) | "0" (LOW) | "1" (HIGH) | "1" (HIGH) |

A problem with the conventional bidirectional input/output buffer of FIG. 1 is that it does not achieve adequate operating speeds to support improved high-speed data communications. Accordingly, a need remains for a faster bidirectional input/output buffer.

SUMMARY OF THE INVENTION

The speed of the restoration circuit in the buffer of FIG. 1 limits the speed of the bidirectional buffer due to a decrease in the switching speed when the voltage comparator 102A and the reference voltage Vref are selected. This is because the conventional bidirectional input/output buffer of FIG. 1 operates in voltage mode.

Therefore, an object of the invention is to provide a bidirectional input/output buffer which is capable of operating in a current mode.

It is another object of the invention to provide a bidirectional input/output buffer which is capable of transmitting data between chips at high speed.

It is still another object of the invention to provide a bidirectional input/output buffer using a current source.

To achieve these and other objects, a bidirectional input/output buffer constructed in accordance with the present invention operates in a current mode to increase the data transfer rate between devices connected by a bidirectional transmission line. The buffer includes an output current source for generating an output current responsive to a data output signal. The output current is combined with an output current indicative of a data input signal received from another device over a transmission line, thereby forming a mixed current signal. The data input signal is restored from the mixed signal by a restoring circuit that compares the mixed signal to a reference current that depends on the value of the data output signal. The restoring circuit includes a current mirror and a reference current source that generates a reference current in response to the data output signal. To provide additional performance, an embodiment of a bidirectional input/output buffer utilizes a switchless structure having two comparators that compare the mixed signal to two different reference signals, thereby generating two comparison signals. A selector circuit selects one of the two comparison signals as the restored data input signal responsive to the data output signal.

A current-mode bidirectional input/output buffer embodying the present invention includes an output current source for providing an output current corresponding to an output voltage to be transmitted to the exterior, a reference current source for providing a reference current corresponding to a level of the output voltage, an input/output line provided as a mixed signal of the output current and an input current corresponding to an input voltage received from the exterior, and a restoration circuit for restoring only the input voltage by comparing the reference current with the mixed signal.

Preferably, the restoration circuit includes a current mirror having one terminal connected to the output current source, and a current comparator connected to the other terminal of the current mirror having the same current value as one terminal of the current mirror and to the reference current source. The current mirror has a first transistor having a channel connected between the output current source and a ground voltage and having a gate and a drain commonly connected to each other, and a second transistor having a channel connected between one terminal of the reference current source and the ground voltage and having a gate connected to the gate of the first transistor. If the output voltage is a logic "HIGH" level, the reference current is a value obtained by multiplying 0.75 by the output current, and if the output voltage is a logic "LOW" level, the reference current is a value obtained by multiplying 0.25 by the output current.

One aspect of the present invention is a bidirectional input/output buffer comprising: an output terminal for coupling the buffer to a transmission line and for combining a first current corresponding to an output data signal and a second current corresponding to an input data signal, thereby generating a mixed signal; a first current source coupled to the output terminal for generating the first current responsive to the output data signal; and a restoring circuit coupled to the output terminal for restoring the input data signal from the mixed signal. The restoring circuit can include: a second current source for generating a reference current responsive to the output data signal; and a current mirror coupled between the output terminal and the second current source. Alternatively, the restoring circuit can include: a first comparator coupled to the output terminal for comparing the mixed signal to a first reference signal, thereby generating a first comparison signal; a second comparator coupled to the output terminal for comparing the mixed signal to a second reference signal, thereby generating a second comparison signal; and a selector circuit coupled to the first and second comparators for selecting either the first or second comparison signal responsive to the output data signal.

Another aspect of the present invention is a bidirectional input/output buffer comprising: an output terminal for coupling the buffer to a transmission line and for combining a first current corresponding to an output data signal and a second current corresponding to an input data signal, thereby generating a mixed signal; means for generating the first current responsive to the output data signal; and means for restoring the input data signal from the mixed signal.

A further aspect of the present invention is a method for buffering data for an input/output line comprising: generating a first current corresponding to an output data signal; combining the first current with a second current corresponding to an input data signal, thereby generating a mixed signal; and restoring the input data signal from the mixed signal. Restoring the input data signal from the mixed signal can include: generating a reference signal corresponding to the output data signal; and comparing the mixed signal to the reference signal. Alternatively, restoring the input data signal from the mixed signal can include: generating a first reference signal; comparing the mixed signal to the first reference signal, thereby generating a first comparison signal; generating a second reference signal; comparing the mixed signal to the second reference signal, thereby generating a second comparison signal; and selecting either the first comparison signal or the second comparison signal responsive to the data output signal.

An advantage of the present invention is that it increases the operating speed of a bidirectional input/output buffer.

The foregoing and other objects, features and advantages of the invention will become more readily apparent from the following detailed description of a preferred embodiment of the invention which proceeds with reference to the accompanying drawings.

DETAILED DESCRIPTION

Figure 1:
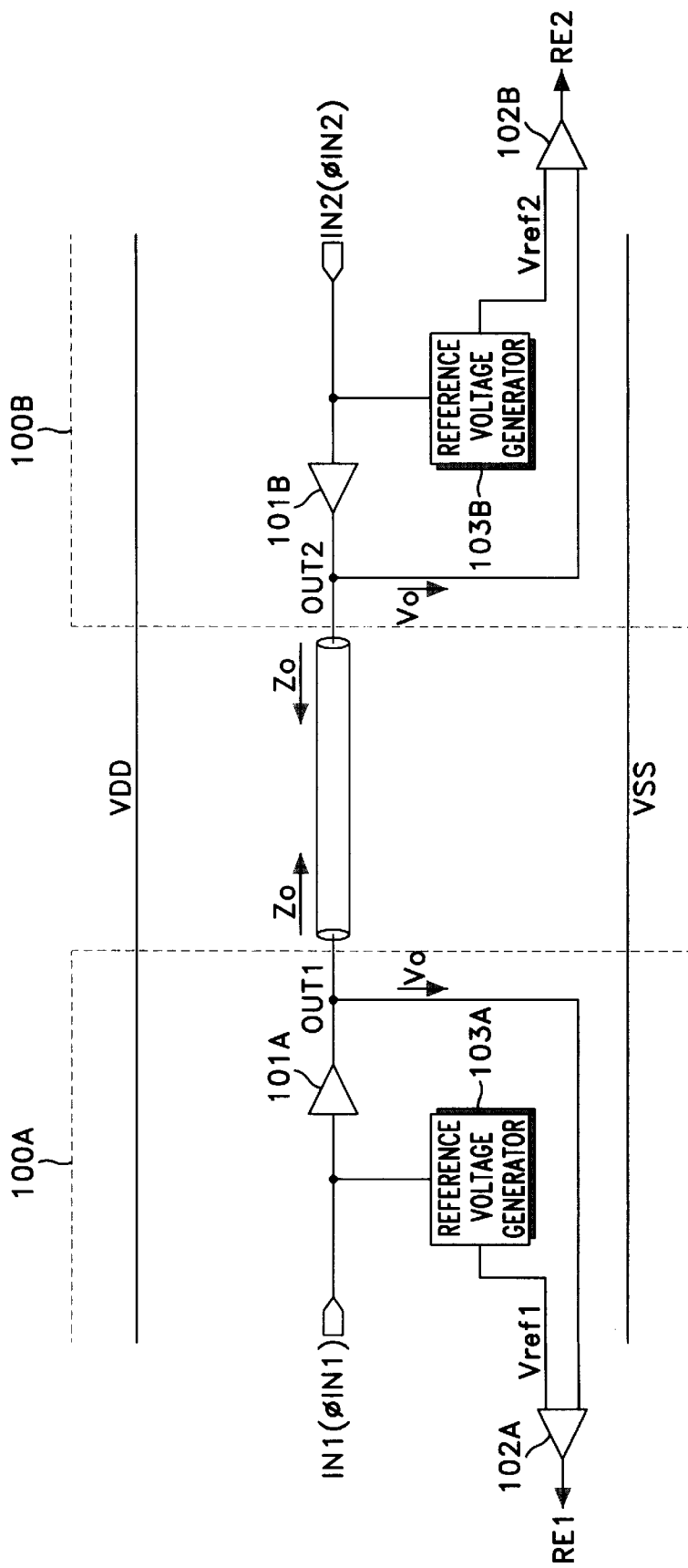
FIG. 1 is schematic diagram of a prior art bidirectional input/output buffer that operates in a voltage mode.
Figure 2:
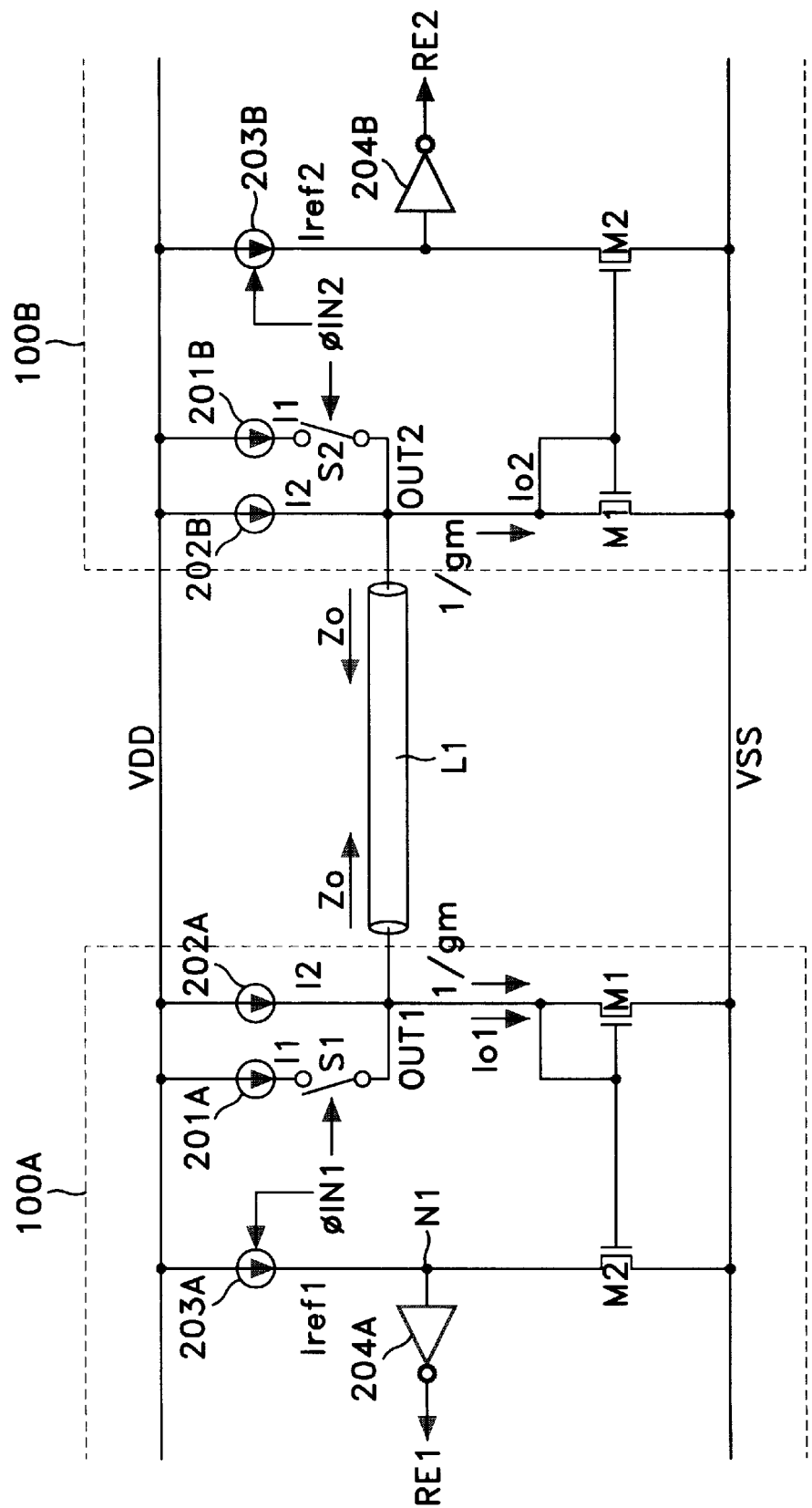
FIG. 2 is a schematic diagram of a first embodiment of a current-mode bidirectional input/output buffer according to the present invention.

FIG. 2 is a schematic diagram illustrating the construction of a first embodiment of a current-mode bidirectional input/output buffer according to the present invention. Referring to FIG. 2, the current-mode bidirectional input/output buffer includes an output current source consisting of current sources 201A and 202A, and a restoring circuit consisting of a reference current source 203A, a current mirror formed from NMOS transistors M1 and M2, and a logic circuit 204A. The current mirror has an input terminal connected to an output node OUT1, which is connected to one terminal of the output current source, and output terminal connected to a reference node N1 to which the reference current source 203A and the transistor M2 are connected.

A connection node between the output current source and the drain of NMOS transistor M1 forms the output terminal OUT1 which is connected to a data transmission line L1 which transmits data between two chips 100A and 100B. Current source 201A supplies a current I1 and current source 202A supplies a current I2. A switch S1 for performing a switching operation in response to a voltage signal φIN1 is connected to one terminal of the current source 201A and the output terminal OUT1. The chip 100B has the same circuit construction as the bidirectional input/output buffer within the chip 100A. The logic circuit 204A generates a restored voltage value according to the amount of current discharged by the transistor M2.

In operation, the current Io1 flowing through the channel of transistor M1 is determined by the voltage of a data output signal φIN1, which is to be transmitted from the chip 100A to an external device (in this case, to chip 100B), and the voltage of output data signal φIN2, which is received from the external device. Io1 is the average value of the output currents of the chips 100A and 100B. The value of the output current Io1 is either I1+I2, 0.5×I1+I2, or I2. That is, if both of the voltage signals φIN1 and φIN2 are at logic "HIGH" levels, the output current Io1 is I1+I2; if only one of the voltage signals φIN1 and φIN2 is at a logic "HIGH" level, the output current Io1 is 0.5×I1+I2; and if both of the voltage signals φIN1 and φIN2 are at logic "LOW" levels, the output current is I2. Therefore, a signal received from an external device is restored by comparing a reference current Iref1, which is selected according to the voltage signal φIN1, with the output current Io1. The following Table 2 shows the values of the restored signals RE1 and RE2, the values of the reference currents Iref1 and Iref2, and the values of the output currents Io1 and Io2 for various combinations of φIN1 and φIN2.

TABLE 2

| φIN1 | "0" (LOW) | "0" (LOW) | "1" (HIGH) | "1" (HIGH) |
|---|---|---|---|---|
| φIN2 | "0" (LOW) | "1" (HIGH) | "0" (LOW) | "1" (HIGH) |
| Iref | 10.25 × I1 + I2 | 0.25 × I1 + I2 | 0.75 × I1 + I2 | 0.75 × I1 + I2 |
| Iref | 20.25 × I1 + I2 | 0.75 × I1 + I2 | 0.25 × I1 + I2 | 0.75 × I1 + I2 |
| Io1 = Io2 | I2 | 0.5 × I1 + I2 | 0.5 × I1 + I2 | I1 + I2 |
| restored signal (RE1) | "0" (LOW) | "1" (HIGH) | "0" (LOW) | "1" (HIGH) |
| restored signal (RE2) | "0" (LOW) | "0" (LOW) | "1" (HIGH) | "1" (HIGH) |

In order to match the characteristic impedance Zo of the transmission line L1 to the input impedance of the buffer, the size of transistor M1 is adjusted so that the reciprocal of the transconductance (gm) of transistor M1 is identical to the impedance Zo. This eliminates reflected waves which may be generated at radio frequencies.

Figure 3:
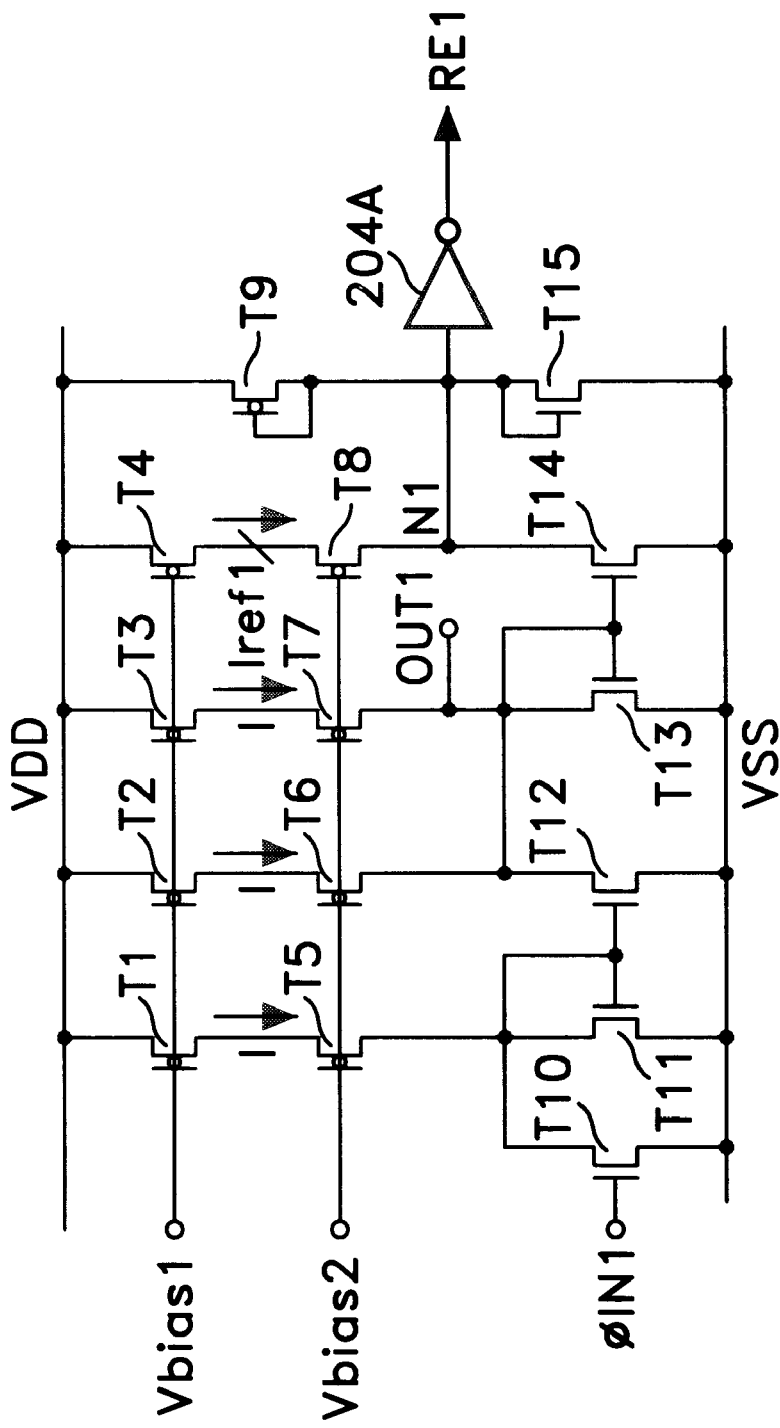
FIG. 3 is a schematic diagram of a second embodiment of a current-mode bidirectional input/output buffer according to the present invention.

FIG. 3 is a detailed circuit diagram of a second embodiment of a current-mode bidirectional input/output buffer according to the present invention. Referring to FIG. 3, PMOS transistors T1–T4 have sources connected to a power supply voltage VDD and gates connected to a bias terminal Vbias1 for receiving a bias voltage signal. PMOS transistors T5–T8 have sources connected to the drains of PMOS transistors T1–T4 and gates connected to a bias terminal Vbias2. An NMOS transistor T10 has a channel connected between the drain of the PMOS transistor T5 and a power supply ground voltage VSS.

A current mirror consisting of transistors T11 and T12 is connected between the PMOS transistors T5 and T6 and the ground voltage VSS so that the drain current of the transistor T5 has the same value as that of the transistor T6. Another current mirror consisting of transistors T13 and T14 is connected between the transistors T7 and T8 and the ground voltage VSS so that the current through the drain of transistor T7, which is connected to the output terminal OUT1, has the same value as that through the drain of the transistor T8. The drain of transistor T12 is also connected to the output terminal OUT1. A common reference node N1, to which the drains of the transistors T8 and T14 are connected, is connected to the input terminal of an inverter 204A. A diode-connected PMOS transistor T9 is connected between the common node N1 and the power voltage VDD. A diode-connected NMOS transistor T15 is connected between the common node N1 and the ground voltage VSS.

In operation, the transistors T1–T8 operate as cascade current sources to supply currents I and Iref1. The NMOS transistor T10, which is a current-mode switch, is operated responsive to the data output voltage signal φIN1 which is applied through the input terminal IN1. If the voltage signal φIN1 is at a logic "HIGH" level, the current I flowing through the transistors T1 and T5 is discharged through the transistor T10 which is turned on by the voltage signal φIN1, and thus, no current flows into the transistors T11 and T12. Therefore, the current I flowing through transistors T2 and T6 is supplied to the output terminal OUT1. In addition to the current I supplied through the transistors T3 and T7, the current I/2 (if either of the voltage signals φIN1 or φIN2 is at a logic "HIGH" level) or the current I (if both of the signals φIN1 and φIN2 are at logic "HIGH" levels) is supplied to the transistor T13 in accordance with the signal data input signal received from an external devices If the signal φIN1 is at a logic "LOW" level, transistors T11 and T12 are turned on, and the current I flowing through the transistors T1 and T5 is supplied to transistor T11. The current I supplied through the transistors T2 and T6 is mirrored through the transistor T12. Therefore, the current I supplied through the transistors T2 and T6 does not flow into the output terminal OUT1. Consequently, in response to the data input signal received from an external device, the current I supplied through the transistors T3 and T7 flows into the transistor T13, or the current I/2 from the external device (when the signal φIN2 is at a logic "HIGH" level) is also supplied to the transistor T13 in addition to the current I.

Since the transistors T13 and T14 are arranged in a current mirror configuration, the same current that flows into the transistor T13 tends to flow into the transistor T14 according to the ratio of the channel width to the channel length. The reference current Iref1 supplied through the PMOS transistors T4 and T8, which constitute a reference current source, is determined in accordance with to the signal φIN1. Therefore, the transistors T4, T8 and T14 constitute a current comparator for converting the difference in the currents into a voltage signal. That is, the result obtained by comparing the reference current Iref1 flowing through the transistors T4 and T8 with the current discharged through the transistor T14 appears as the drain voltage of the transistor T14, and the external signal is restored from this result.

PMOS transistor T9 and NMOS transistor T15 are diode load structures and form a low impedance path. Hence, transistors T9 and T15 increase the output speed by reducing the voltage swing of the current comparator. In other words, if the current discharged through the transistor T14 is smaller than the reference current Iref1 supplied through the transistors T4 and T8, the transistor T15 functions as current path, and if the former is larger than the latter, the transistor T9 functions as the current path, thereby reducing the voltage swing and simultaneously eliminating switching noise which is expressed as dI/dt.

Figure 4:
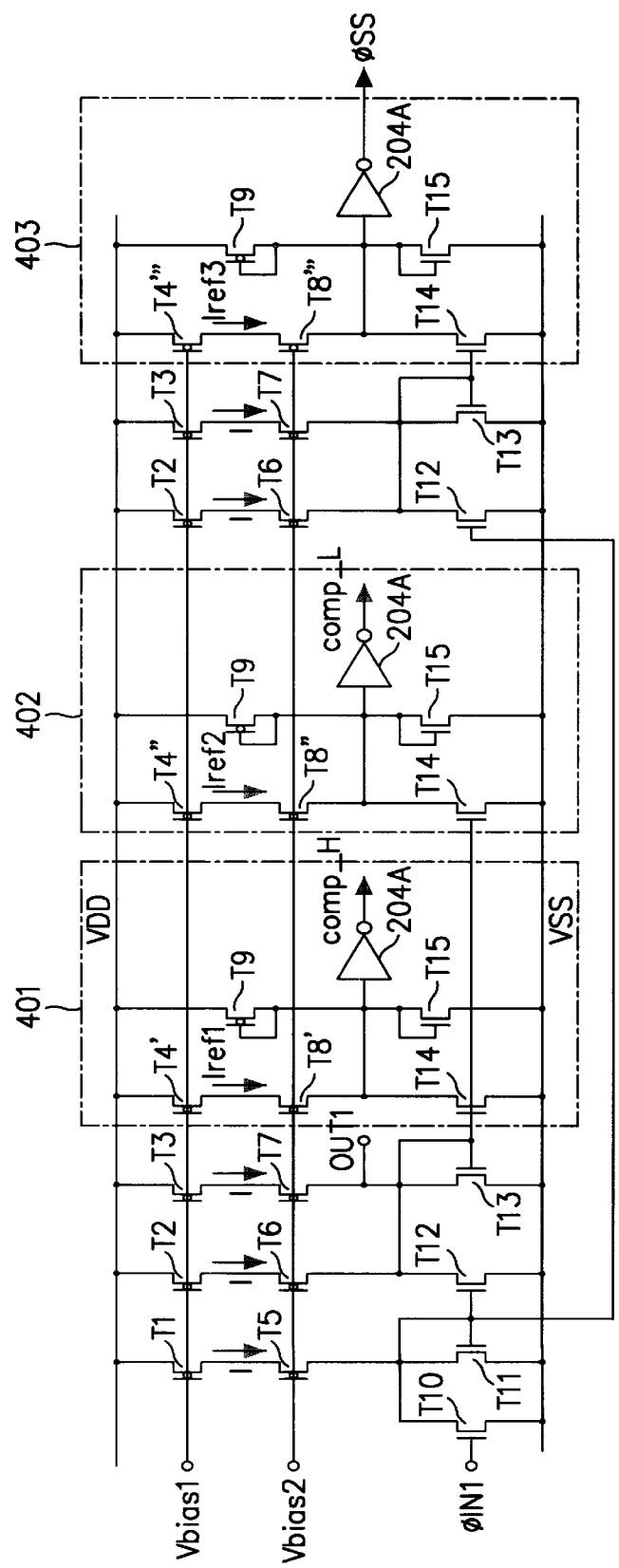
FIG. 4 is a schematic diagram of a third embodiment of a current-mode bidirectional input/output buffer according the present invention.

FIG. 4 is a detailed circuit diagram of a third embodiment of a current-mode bidirectional input/output buffer according the present invention. The embodiment shown in FIG. 4 includes a scheme for supplying the signal φIN1 to the output terminal OUT1 by using a circuit consisting of T1–T3, T5–T7 and T10–T13 in a manner similar to that described with respect to FIG. 3. However, the circuit of FIG. 4 includes comparators 401, 402 and 403, for generating comparison signals comp_H, comp_L and φSS, respectively through schemes similar to that described in FIG. 3 for generating the signal RE1. That is, the comparators 401, 402, and 403 in FIG. 4 have structures similar to the structure formed by T4, T8, T9, T14, T15 and 204A in FIG. 3. However, the ratio of the channel width to the channel length of the transistors in the comparators of FIG. 4 are set to different values in order to vary the level of each reference current.

The values of many of the signals in FIG. 4 are generally the same as those shown in Table 2 above. If the currents I1 and I2 shown in FIG. 2 have the same value I, the circuit of FIG. 4 requires two reference currents 1.75I and 1.25I according to the signal φIN1. In order to improve the speed, the reference currents 1.75I and 1.25I are selected so as to compare the two reference currents without using a switching structure. These reference currents 1.75I and 1.25I are provided through transistors T4' and T8', and T4" and T8", respectively. The reference current 1.75I is the current value of Iref1 and 1.25I is the current value of Iref2. That is, the first comparator 401 for generating the signal comp_H has the ratio of the channel width to the channel length of the transistor T4' set to 1.75 in order to provide the reference current 1.75I, and a second comparator 402 for generating the signal comp_L has the ratio of the channel width to the channel length of the transistor T4" set to 1.25 in order to provide the reference current 1.25I. The PMOS transistors T8' and T8" which are connected to the drains of the PMOS transistors T4' and T4", respectively, are used to accurately adjust the values of the reference currents 1.75I and 1.25I. These transistors T8' and T8" may optionally be omitted. Other transistors T5–T7 are used to raise the accuracy of the current I, and they may be also omitted.

The signal φSS has the same value as the signal φIN1, but with a time delay. The signal φSS is delayed until the signal φIN1 is generated as the signals comp_H and comp_L through the current comparators 401 and 402. The delay time until the signal φSS is generated is achieved by passing the signal φIN1 through a third current comparator 403 which has the same form as the current comparators 401 and 402. The third current comparator 403, which generates the signal φSS, has the ratio of the channel width to the channel length of the transistor T4''' set to 1.5 in order to provide a reference current Iref3. Consequently, the data input signal received from an external device can be restored by using the signals comp_H, comp_L and φSS.

Figure 5:
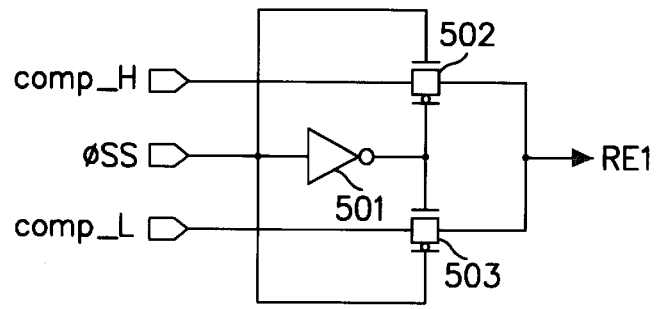
FIG. 5 is schematic diagram of selection circuit constructed in accordance with the present invention for use with the circuit of FIG. 4.

FIG. 5 is schematic diagram of a logic circuit for selecting either of comp_H or comp_L as the restored signal RE1. As shown in FIG. 5, the signals comp_H and comp_L are connected to transmission gates 502 and 503 and controlled by the signal φSS. If the signal φSS is a logic "HIGH" level, the signal supplied to the output terminal OUT1 is compared with the reference current 1.75I, and the restored signal comp_H is supplied to the receiving terminal RE1 through the switching operation of the transmission gate 502. If the signal φSS is a logic "LOW" level, the signal supplied to the output terminal OUT1 is compared with the reference current 1.25I and the restored signal comp_L is supplied to the receiving terminal RE1 through the switching operation of the transmission gate 503.

Figure 6:
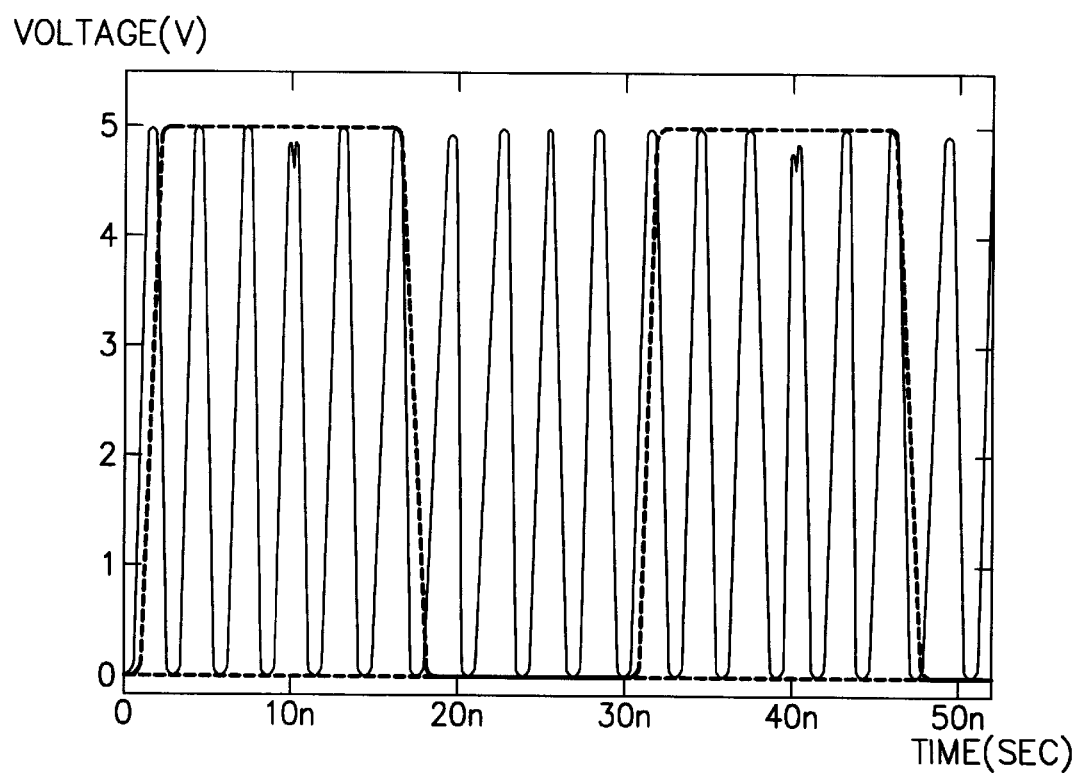
FIG. 6 is a waveform diagram showing the operation of a current-mode bidirectional input/output buffer according to the present invention.

FIG. 6 is an output waveform showing the operation of a current-mode bidirectional input/output buffer according to the present invention. FIG. 6 shows the waveforms of the restored signals through the receiving terminals RE1 and RE2 when transmitting data under conditions in which the supply voltage is 5 V, the output of the signal IN1 is 666 Mbps and the output of the signal IN2 is 66 Mbps. FIG. 6 shows that bidirectional transmission capability of 1.33 Gbps can be achieved with the present invention.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A bidirectional input/output buffer comprising:
   an output terminal for coupling the buffer to a transmission line and for combining a first current corresponding to an output data signal and a second current corresponding to an input data signal, thereby generating a mixed signal;
   a first current source coupled to the output terminal for generating the first current responsive to the output data signal; and
   a restoring circuit coupled to the output terminal for restoring the input data signal from the mixed signal;
   wherein the first current is substantially independent of the input data signal.

2. A buffer according to claim 1 further including a current switch coupled to the first current source for controlling the first current responsive to the output data signal.

3. A bidirectional input/output buffer comprising:
   an output terminal for coupling the buffer to a transmission line and for combining a first current corresponding to an output data signal and a second current corresponding to an input data signal, thereby generating a mixed signal;
   a first current source coupled to the output terminal for generating the first current responsive to the output data signal; and
   a restoring circuit coupled to the output terminal for restoring the input data signal from the mixed signal;
   wherein the restoring circuit includes:
      a second current source for generating a reference current responsive to the output data signal; and
      a current mirror coupled between the output terminal and the second current source.

4. A buffer according to claim 3 further including a third current source coupled to the output terminal to provide a bias current thereto.

5. A buffer according to claim 3 wherein:
   the first current source includes a first transistor having a current path coupled between a first power supply terminal and the output terminal and a control terminal coupled to receive a bias signal;
   the current mirror includes:
      a second transistor having a current path coupled between the output terminal and a second power supply node and a control terminal coupled to the output terminal, and
      a third transistor having a current path coupled between a reference node and the second power supply terminal and a control terminal coupled to the control terminal of the second transistor; and
   the second current source includes a fourth transistor having a current path coupled between the first power supply terminal and the reference node and a control terminal coupled to receive the bias signal.

6. A buffer according to claim 5 further including a bias current source including a fifth transistor having a current path coupled between the first power supply terminal and the output terminal and a control terminal coupled to receive the bias signal.

7. A bidirectional input/output buffer comprising:
   an output terminal for coupling the buffer to a transmission line and for combining a first current corresponding to an output data signal and a second current corresponding to an input data signal, thereby generating a mixed signal;
   a first current source coupled to the output terminal for generating the first current responsive to the output data signal;
   a restoring circuit coupled to the output terminal for restoring the input data signal from the mixed signal; and further including a current switch coupled to the first current source for controlling the first current responsive to the output data signal;

wherein the current switch includes:

a second current source for generating a third current;

a current mirror coupled between the second current source and the output terminal; and a transistor coupled to the current mirror for diverting the third current responsive to the output data signal.

8. A bidirectional input/output buffer comprising:

an output terminal for coupling the buffer to a transmission line and for combining a first current corresponding to an output data signal and a second current corresponding to an input data signal, thereby generating a mixed signal;

a first current source coupled to the output terminal for generating the first current responsive to the output data signal; and a restoring circuit coupled to the output terminal for restoring the input data signal from the mixed signal;

wherein the restoring circuit includes:

a first comparator coupled to the output terminal for comparing the mixed signal to a first reference signal, thereby generating a first comparison signal;

a second comparator coupled to the output terminal for comparing the mixed signal to a second reference signal, thereby generating a second comparison signal; and a selector circuit coupled to the first and second comparators for selecting either the first or second comparison signal responsive to the output data signal.

9. A buffer according to claim 8 wherein the restoring circuit further includes a third comparator coupled to the selection circuit for delaying the output data signal, thereby generating a select signal for controlling the selector circuit responsive to the output data signal.

10. A buffer according to claim 8 wherein the restoring circuit includes:

a second current source for generating a first reference current, a third current source for generating a second reference current;

a two-output current mirror having:

an input terminal coupled to the output terminal, a first output terminal coupled to the second current source for generating a first comparison signal, and a second output terminal coupled to the third current source for generating a second comparison signal; and a selector circuit coupled to the first and second comparators for selecting either the first or second comparison signal responsive to the output data signal.

11. A bidirectional input/output buffer comprising:

an output terminal for coupling the buffer to a transmission line and for combining a first current corresponding to an output data signal and a second current corresponding to an input data signal, thereby generating a mixed signal;

means for generating the first current responsive to the output data signal; and means for restoring the input data signal from the mixed signal;

wherein the first current is substantially independent of the input data signal.

12. A bidirectional input/output buffer comprising:

an output terminal for coupling the buffer to a transmission line and for combining a first current corresponding to an output data signal and a second current corresponding to an input data signal, thereby generating a mixed signal;

means for generating the first current responsive to the output data signal; and means for restoring the input data signal from the mixed signal;

wherein said means for restoring the input data signal includes:

a first current source for generating a reference current responsive to the output data signal; and a current mirror coupled between the output terminal and the second current source.

13. A bidirectional input/output buffer comprising:

an output terminal for coupling the buffer to a transmission line and for combining a first current corresponding to an output data signal and a second current corresponding to an input data signal, thereby generating a mixed signal;

means for generating the first current responsive to the output data signal; and means for restoring the input data signal from the mixed signal;

wherein said means for restoring the input data signal includes:

means for generating a first comparison signal responsive to the mixed signal;

means for generating a second comparison signal responsive to the mixed signal; and means for selecting either the first or second comparison signal responsive to the output data signal.

14. A bidirectional input/output buffer comprising:

an output terminal for coupling the buffer to a transmission line and for combining a first current corresponding to an output data signal and a second current corresponding to an input data signal, thereby generating a mixed signal;

means for generating the first current responsive to the output data signal;

means for restoring the input data signal from the mixed signal; and means for controlling said means for generating the first current responsive to the output data signal.

15. A method for buffering data for an input/output line comprising:

generating a first current corresponding to an output data signal;

combining the first current with a second current corresponding to an input data signal, thereby generating a mixed signal; and restoring the input data signal from the mixed signal;

wherein the first current is substantially independent of the input data signal.

16. A method according to claim 15 wherein restoring the input data signal from the mixed signal includes:

generating a reference signal corresponding to the output data signal; and comparing the mixed signal to the reference signal.

17. A method according to claim 16 wherein the reference signal and the mixed signal are both current signals.

18. A method for buffering data for an input/output line comprising:

generating a first current corresponding to an output data signal;

combining the first current with a second current corresponding to an input data signal, thereby generating a mixed signal; and restoring the input data signal from the mixed signal;

wherein restoring the input data signal from the mixed signal includes:
    generating a first reference signal;
    comparing the mixed signal to the first reference signal, thereby generating a first comparison signal;
    generating a second reference signal;
    comparing the mixed signal to the second reference signal, thereby generating a second comparison signal; and
    selecting either the first comparison signal or the second comparison signal responsive to the data output signal.

19. A method according to claim 18 wherein the first reference signal, the second reference signal, and the mixed signal are all current signals.

* * * * *